United States Patent
Hou et al.

(10) Patent No.: US 11,967,546 B2
(45) Date of Patent: Apr. 23, 2024

(54) GIGA INTERPOSER INTEGRATION THROUGH CHIP-ON-WAFER-ON-SUBSTRATE

(71) Applicant: Taiwan Semiconductor Manufacturing Co., Ltd., Hsinchu (TW)

(72) Inventors: Shang-Yun Hou, Jubei (TW); Hsien-Pin Hu, Zhubei (TW); Sao-Ling Chiu, Hsinchu (TW); Wen-Hsin Wei, Hsinchu (TW); Ping-Kang Huang, Chiayi (TW); Chih-Ta Shen, Hsinchu (TW); Szu-Wei Lu, Hsinchu (TW); Ying-Ching Shih, Hsinchu (TW); Wen-Chih Chiou, Zhunan Township (TW); Chi-Hsi Wu, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/870,099

(22) Filed: Jul. 21, 2022

(65) Prior Publication Data
US 2022/0359355 A1 Nov. 10, 2022

Related U.S. Application Data

(62) Division of application No. 16/881,211, filed on May 22, 2020, now Pat. No. 11,728,254.

(51) Int. Cl.
*H01L 23/498* (2006.01)
*H01L 21/48* (2006.01)
*H01L 21/56* (2006.01)
*H01L 23/00* (2006.01)
*H01L 23/31* (2006.01)
*H01L 23/538* (2006.01)

(52) U.S. Cl.
CPC .... *H01L 23/49816* (2013.01); *H01L 21/4853* (2013.01); *H01L 21/56* (2013.01);
(Continued)

(58) Field of Classification Search
CPC ............. H01L 21/4853; H01L 23/3121; H01L 23/3135; H01L 23/49861; H01L 23/5384;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

EP 3605603 A1 2/2020
KR 20160116234 A 10/2016
WO 2019132965 A1 7/2019

*Primary Examiner* — Victor A Mandala
*Assistant Examiner* — Lawrence C Tynes, Jr.
(74) *Attorney, Agent, or Firm* — Slater Matsil, LLP

(57) ABSTRACT

A semiconductor structure includes a first interposer; a second interposer laterally adjacent to the first interposer, where the second interposer is spaced apart from the first interposer; and a first die attached to a first side of the first interposer and attached to a first side of the second interposer, where the first side of the first interposer and the first side of the second interposer face the first die.

20 Claims, 14 Drawing Sheets

(52) U.S. Cl.
CPC .... *H01L 23/3121* (2013.01); *H01L 23/49861* (2013.01); *H01L 24/13* (2013.01); *H01L 23/5385* (2013.01); *H01L 2224/023* (2013.01); *H01L 2225/107* (2013.01)

(58) Field of Classification Search
CPC .......... H01L 23/49833; H01L 23/5385; H01L 23/538–5389; H01L 2924/181; H01L 2224/16225; H01L 2224/32225; H01L 2224/023–024; H01L 24/94; H01L 24/97; H01L 25/042; H01L 25/0655; H01L 25/072; H01L 25/0753; H01L 25/115
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,522,508 B2 | 12/2019 | Hu et al. | |
| 2016/0276307 A1 | 9/2016 | Lin | |
| 2017/0053897 A1 | 2/2017 | Lai et al. | |
| 2018/0005984 A1 | 1/2018 | Yu et al. | |
| 2018/0204791 A1* | 7/2018 | Chen | H01L 25/0652 |
| 2019/0341368 A1 | 11/2019 | Hu et al. | |
| 2019/0371778 A1 | 12/2019 | Sankman et al. | |
| 2020/0098692 A1 | 3/2020 | Liff et al. | |
| 2020/0273839 A1 | 8/2020 | Elsherbini et al. | |
| 2020/0312826 A1 | 10/2020 | Jung et al. | |
| 2020/0395313 A1* | 12/2020 | Mallik | H01L 25/50 |
| 2021/0225666 A1* | 7/2021 | Lin | H01L 21/563 |

* cited by examiner

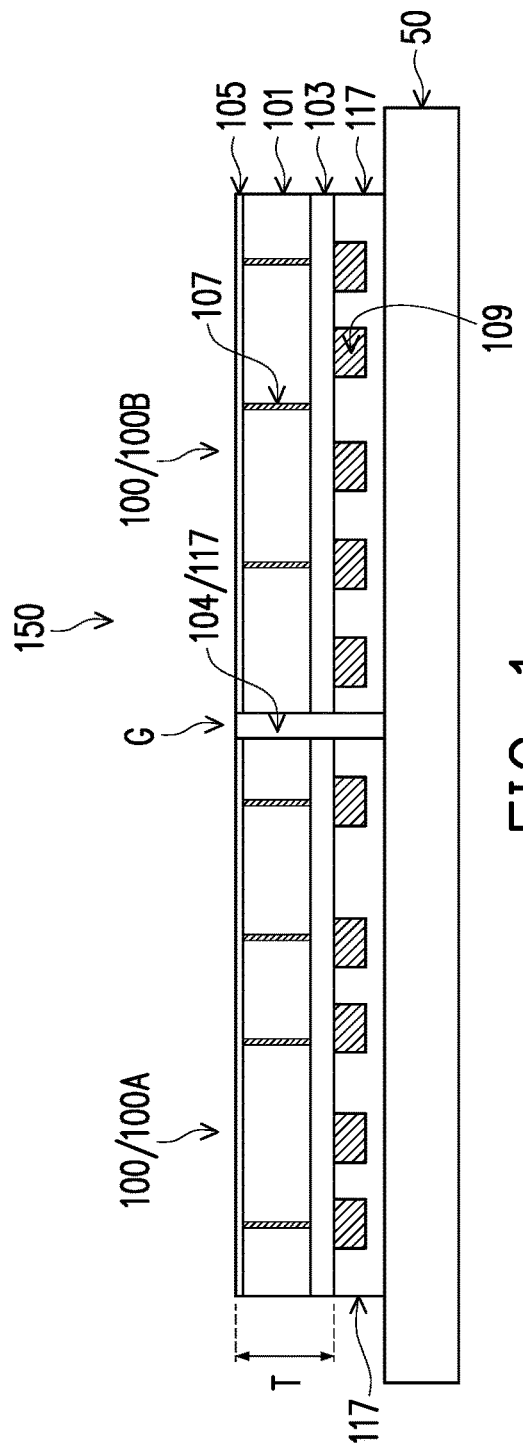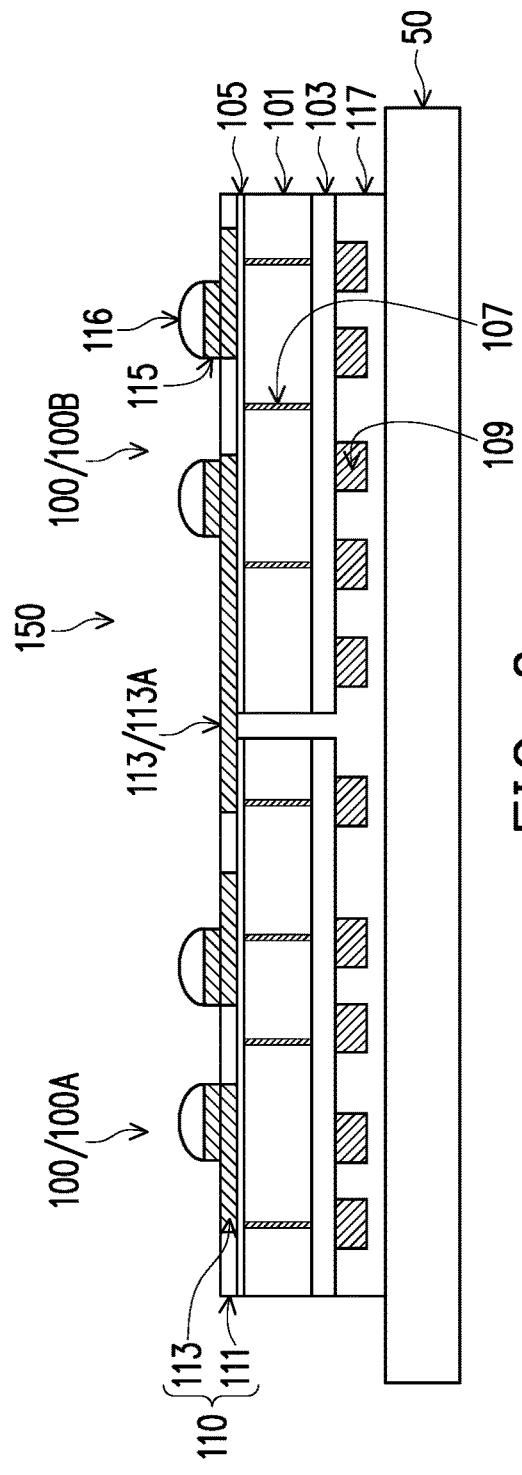

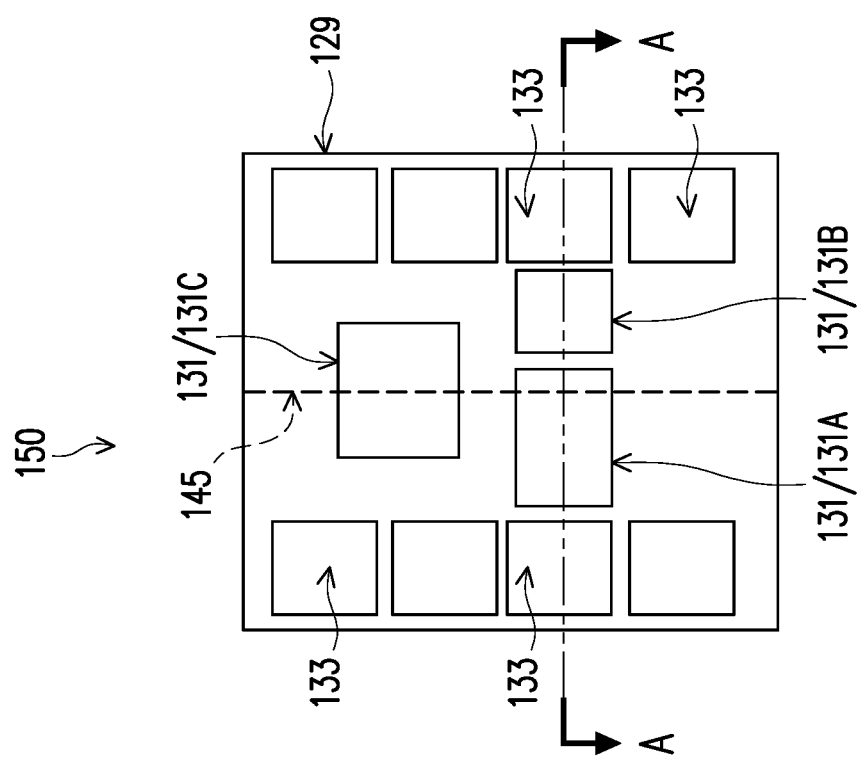

GIGA INTERPOSER INTEGRATION THROUGH CHIP-ON-WAFER-ON-SUBSTRATE

PRIORITY CLAIM AND CROSS-REFERENCE

This application is a divisional of U.S. patent application Ser. No. 16/881,211, filed on May 22, 2020 and entitled "Giga Interposer Integration through Chip-On-Wafer-On-Substrate," which application is incorporated herein by reference.

TECHNICAL FIELD

The present invention relates generally to semiconductor packages, and, in particular embodiments, to Chip-On-Wafer-On-Substrate (CoWoS) packages and methods for forming CoWoS packages.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-4, 5A and 5B illustrate various views of a Chip-On-Wafer (CoW) device at various stages of fabrication, in an embodiment;

DETAILED DESCRIPTION OF ILLUSTRATIVE EMBODIMENTS

Figure 3:
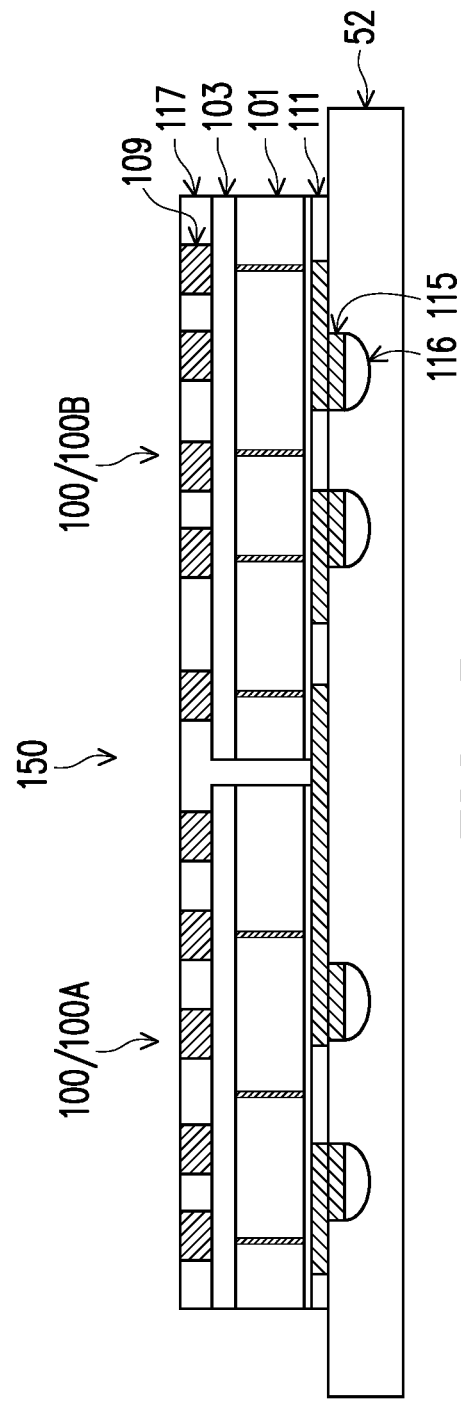

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise described, the same reference number in different figures refers to the same or similar component formed by a same or similar process using a same or similar material(s).

In some embodiments, a CoW device includes a plurality of dies attached to a first interposer and to a second interposer. The second interposer is spaced apart from the first interposer, and is positioned side-by-side with the first interposer. The first interposer and the second interposer are embedded in first molding material. A redistribution structure may be formed along a backside of the first interposer and along a backside of the second interposer. A first die of the plurality of the dies is bonded to a front-side of the first interposer and to a front-side of the second interposer. A second die of the plurality of the dies is bonded to the front-side of the second interposer only. The CoW device is then bonded to a substrate to form a CoWoS device. The disclosed embodiments allow multiple dies to be integrated in the CoW device using multiple smaller interposers instead of a single large interposer. The smaller interposers avoid or reduce warpage of the interposers. Additional benefit includes easier bonding of the interposers with the substrate during formation of the CoWoS device, less stress in the CoWoS structure, and reduced risk of cracking or delamination for the interposer and/or substrate.

FIGS. 1-4, 5A and 5B illustrate various views of a Chip-On-Wafer (CoW) device 150 at various stages of fabrication, in an embodiment. Throughout the discussion herein, a CoW device may also be referred to as a CoW package, and a CoWoS device may also be referred to as a CoWoS package.

Referring now to FIG. 1, a first interposer 100A and a second interposer 100B are attached to a support 50, which support 50 may be, e.g., a tape supported by a frame. In some embodiments, the support 50 is a carrier. The support 50 is removed from the final product in subsequent processing. The first interposer 100A is placed laterally adjacent to (e.g., side-by-side with) the second interposer 100B with a gap G in between. In other words, the first interposer 100A is spaced apart from the second interposer 100B. The first interposer 100A and the second interposer 100B may be collectively referred to as interposers 100.

In some embodiments, each of the interposers 100 (e.g., 100A or 100B) includes a substrate 101, a front-side dielectric layer 103, a backside dielectric layer 105, and conductive paths 107 (e.g., through-substrate vias (TSVs)). In the example of FIG. 1, each interposer also has a plurality of conductive bumps 109 at its front-side. The conductive bumps 109 are electrically coupled to the conductive paths 107, in the illustrated embodiment. The conductive bumps 109 may be copper pillar, for example.

In the example of FIG. 1, each of the interposers 100 has a molding material 117 formed at its front side around the conductive bumps 109, and the interposers 100 are attached to the support 50 through the molding material 117. The molding material 117 may be conterminous with each of the interposers 100 such that sidewalls of the molding material 117 are aligned with respective sidewalls of the interposer 100. The molding material 117 may comprise an epoxy, an organic polymer, a polymer with or without a silica-based or glass filler added, or other materials, as examples.

After the interposers 100 are attached to the support 50, a molding material 104 is formed to fill the gap G between the interposers 100. The molding material 104 may comprise a same material as the molding material 117, thus details are not repeated. A polishing process, such as chemical mechanical polishing (CMP), may be performed next to remove excess portions of the molding material 104 from the upper surfaces of the backside dielectric layers 105, such that the molding material 104 and the backside dielectric layers 105 have a coplanar upper surface. In the illustrated embodiment, the molding material 104 and the molding material 117 are formed of a same material, and therefore, are shown as a continuous volume of the molding material 117 in subsequent figures.

The substrate 101 of each of the interposers 100 is a silicon substrate, in the illustrated embodiment, although other suitable substrate, such as glass, ceramic, or the like, may also be used. The conductive paths 107 may be TSVs or any other suitable conductive paths. In the discussion hereinafter, the conductive paths 107 may be referred to as TSVs or TSV conductors, with the understanding that any suitable conductive paths may be used. In embodiments where conductive paths 107 are TSVs, TSVs 107 may be formed by initially forming TSV conductors 107 partially through the substrate 101, then thinning the substrate 101 later to expose the TSVs 107. In other embodiments, TSVs 107, when formed initially, extends through the substrate 101, and no thinning of the substrate 101 is needed. The TSV conductors 107 may be formed by applying and developing a suitable photoresist to the substrate 101 and then etching the substrate 101 to generate TSV openings (filled later as discussed below).

Once the openings for the TSV conductors 107 have been formed, the openings for the TSV conductors 107 may be filled with, e.g., a liner (not separately illustrated in FIG. 1), a barrier layer (also not separately illustrated in FIG. 1), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, atomic layer deposition, or the like.

The barrier layer may comprise an electrically conductive material such as titanium nitride, although other materials, such as tantalum nitride, titanium, tantalum, or the like, may alternatively be utilized. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used. The barrier layer may be formed so as to contour to the underlying shape of the opening for the TSV conductors 107.

The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the TSV conductors 107. Once the openings for the TSV conductors 107 have been filled, excess barrier layer and excess conductive material outside of the openings for the TSV conductors 107 may be removed through a grinding process such as chemical mechanical polishing (CMP), although any suitable removal process may be used.

Each of the front-side dielectric layer 103 and the backside dielectric layer 105 comprises a suitable dielectric material, such as silicon oxide, silicon nitride, low-k dielectrics such as carbon doped oxides, extremely low-k dielectrics such as porous carbon doped silicon dioxide, combinations thereof, or the like. In some embodiments, the dielectric material for the front-side dielectric layer 103 (or the backside dielectric layer 105) comprises a polymer material such as low temperature polyimide (PI), polybenzoxazole (PBO), combinations thereof, or the like. Any suitable formation method, such as chemical vapor deposition (CVD), physical vapor deposition (PVD), may be used to form the front-side dielectric layer 103 or the backside dielectric layer 105. Note that the materials used for the front-side dielectric layer 103 and the backside dielectric layer 105 are chosen independently, and therefore, may or may not be the same. In the illustrated embodiment, the front-side dielectric layer 103 and the backside dielectric layer 105 are conterminous with the substrate 101 such that sidewalls of the front-side dielectric layer 103 (and sidewalls of the backside dielectric layer 105) are aligned with respective sidewalls of the substrate 101.

In the example of FIG. 1, the first interposer 100A and the second interposer 100B have a same height T, measured between an exterior surface of the front-side dielectric layer 103 and an exterior surface of the backside dielectric layer 105. In addition, the conductive bumps 109 may also have a same height.

Next, in FIG. 2, a redistribution structure 110 is formed on the backside dielectric layer 105 of the first interposer 100A and on the backside dielectric layer 105 of the second interposer 100B. The redistribution structure 110 is electrically coupled to the TSVs 107 of the first interposer 100A and the TSVs 107 of the second interposer 100B. In FIG. 2, the redistribution structure 110 extends continuously from the first interposer 100A to the second interposer 100B, and sidewalls of the redistribution structure no are aligned with respective sidewalls of the interposers 100A/100B. Conductive connectors 115 (e.g., controlled collapse chip connection bumps (C4 bumps), copper pillars, or the like) are formed over and electrically coupled to the redistribution structure no. Solder regions 116 may be optionally formed on the conductive connectors 115 or formed as a part of the conductive connectors 115.

The redistribution structure 110 in FIG. 2 includes conductive features such as conductive lines 113 formed in a dielectric layer 11. In some embodiments, the redistribution structure 110 includes one or more layers of conductive lines 113 and vias (not illustrated in FIG. 2) formed in one or more dielectric layers 111. In some embodiments, the one or more dielectric layers in are formed of a polymer, such as polybenzoxazole (PBO), polyimide, benzocyclobutene (BCB), or the like. In other embodiments, the dielectric layer in is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers in may be formed by any acceptable deposition process, such as spin coating, chemical vapor deposition (CVD), laminating, the like, or a combination thereof.

In some embodiments, the conductive features of the redistribution structure 110 are formed of a suitable conductive material such as copper, titanium, tungsten, aluminum, or the like. The conductive features may be formed by, e.g., forming openings in the dielectric layer 111 to expose underlying conductive features (e.g., TSVs 107), forming a seed layer over the dielectric layer in and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. In the example of FIG. 2, a conductive line 113A of the redistribution structure 110 extends continuously from the first interposer 100A to the second interposer 100B.

The redistribution structure 110 in FIG. 2 extends continuously from the first interposer 100A to the second interposer 100B. In other embodiments, a first redistribution structure and a second redistribution structure (which is spaced apart (e.g., separated) from the first redistribution structure) are formed along the backside of the first interposer 100A and the backside of the second interposer 100B, respectively. The first redistribution structure is conterminous with the substrate 101 of the first interposer 100A, and the second redistribution structure is conterminous with the substrate 101 of the second interposer 100B. In some embodiments, the redistribution structure no is not formed, and the conductive connectors 115 are formed on the backside dielectric layer 105 and are electrically coupled to the TSVs 107.

Next, in FIG. 3, the structure (e.g., interposers 100 with the redistribution structure 110) in FIG. 2 is released from the support 50, flipped over, and attached to a support 52. The support 52 may be the same as or similar to the support 50. A planarization process, such as CMP, may be performed to recess the molding material 117 such that the conductive bumps 109 are exposed at the upper surface of the molding material 117.

Figure 4:
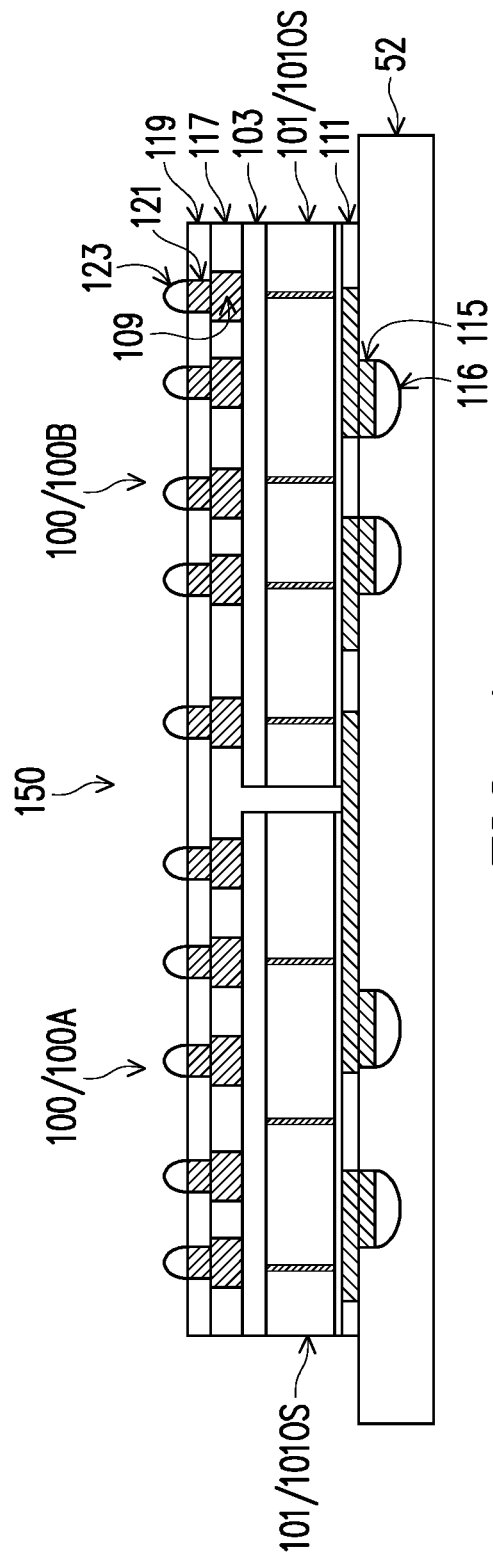

Next, in FIG. 4, a dielectric layer 119, such as a polymer layer (e.g., polyimide layer), is formed over the molding material 117. The dielectric layer 119 may be formed using a same or similar formation process as the front-side dielectric layer 103, thus details are not repeated. Next, openings are formed in the dielectric layer 119, using suitable method such as photolithography and patterning, and conductive bumps 121, such as micro-bumps or copper bumps, are formed in the openings and electrically coupled to respective conductive bumps 109. The conductive bump 121, or the combination of the conductive bump 121 and a respective underlying conductive bump 109, may be referred to as a conductive bump of a respective interposer 100 (e.g., 100A or 100B). Solder regions 123 may be optionally formed over the conductive bumps 121.

Figure 5A:
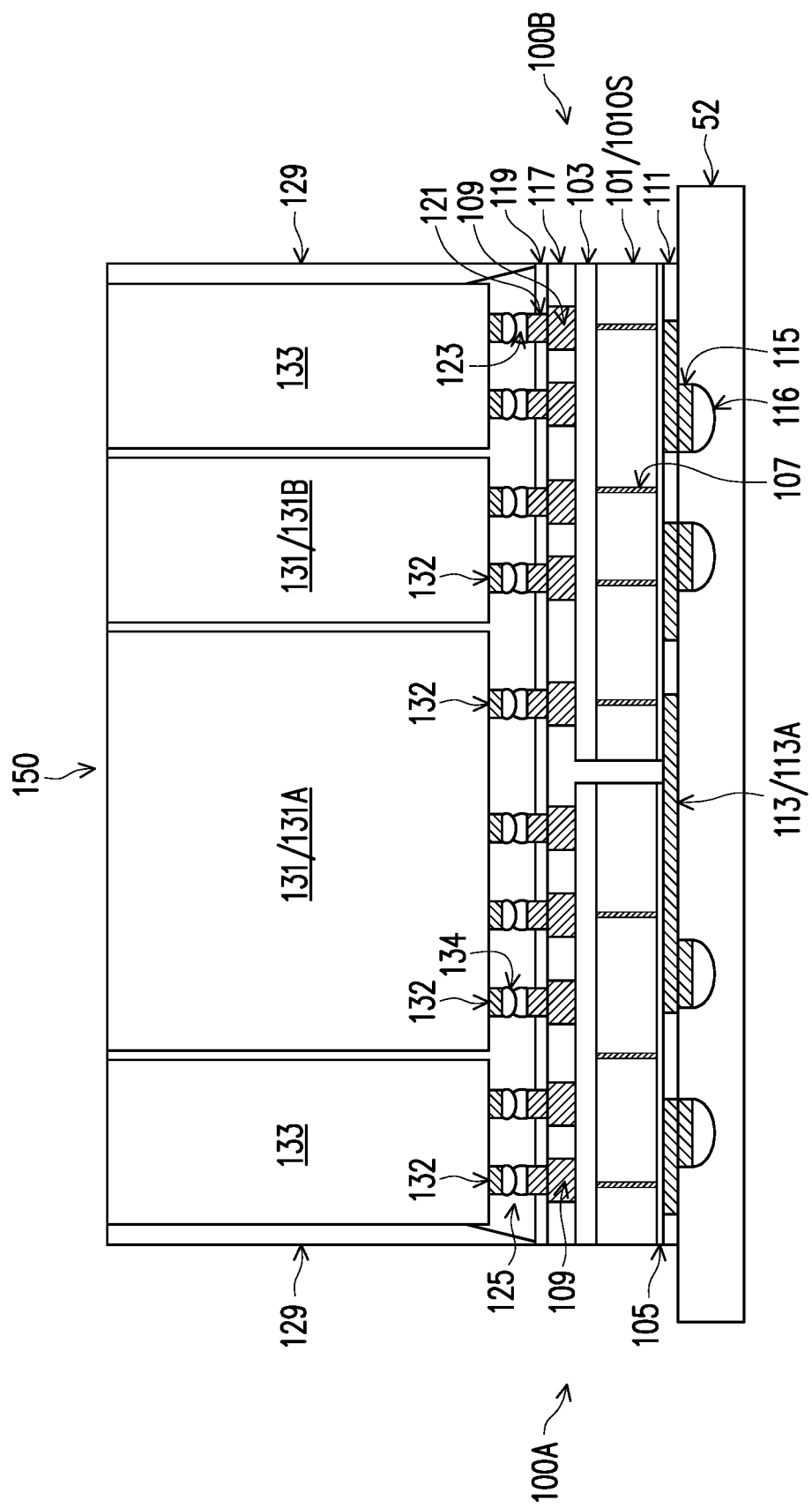

Next, in FIG. 5A, dies 131 (e.g., 131A or 131B) and 133 are bonded to the conductive bumps 121. Each of the dies 131/133 (also referred to as semiconductor dies, integrated-circuit (IC) dies) include a substrate, electrical components (e.g., transistors, resistors, capacitors, or inductors) formed in/on the substrate, and an interconnect structure connecting the electrical components to form functional circuits. In addition, each of the dies 131/133 has die connectors 132, which die connectors 132 are electrically coupled to the functional circuits of the die and provide electrical connection between the die and an external component (e.g., another die, or a printed circuit board).

In some embodiments, the dies 131 and the dies 133 are a same type of dies. In other embodiments, the dies 131 and the dies 133 are different types of dies. For example, the dies 131 may be logic dies, and the dies 133 may be memory dies such as high-bandwidth memory (HBM) dies.

As illustrated in FIG. 5A, the die 131A overlaps with both the first interposer 100A and the second interposer 100B. In other words, a first portion of the die 131A is disposed within lateral extents of the first interposer 100A, and a second portion of the die 131A is disposed within lateral extents of the second interposer 100B. As a result, some of the die connectors 132 of the die 131A are bonded to the conductive bumps 121 of the first interposer 100A, and some of the die connectors 132 of the die 131A are bonded to the conductive bumps 121 of the second interposer 100B. FIG. 5A also illustrates a die 131B disposed within lateral extents of the second interposer 100B, with all of the die connectors 132 of the die 131B bonded to conductive bumps 121 of the second interposer 100B. In addition, dies 133 are bonded to respective conductive bumps 121 and are disposed within lateral extents of respective interposers 100 (e.g., 100A or 100B).

In some embodiments, the dies 131/133 are bonded to the interposers 100 by a reflow process, such that solder regions 134 on top of the die connectors 132 melt and merge with respective solder regions 123 of the interposers 100 to form solder joints between the die connectors 132 and the conductive bumps 121. In other embodiments, the dies 131/133 are bonded to the interposers 100 by a direct bonding process. For example, in an example direct bonding process, no solder region is formed on the die connectors 132 or on the conductive bumps 121, and the conductive bumps 121 (e.g., copper pillars) bonds directly with the die connectors 132 (e.g., copper pillars) through, e.g., copper diffusion by heat and/or pressure in the direct bonding process.

After the dies 131/133 are bonded, an underfill material 125 is formed between the dielectric layer 119 and the dies 131/133. The underfill material 125 may also fill or partially fill the gaps between adjacent dies 131/133. Example materials of the underfill material 125 include, but are not limited to, polymers and other suitable non-conductive materials. The underfill material 125 may be dispensed in the gap between the dielectric layer 119 and the dies 131/133 using, e.g., a needle or a jetting dispenser. A curing process may be performed to cure underfill material 125. The underfill material 125 forms fillets around edges (e.g., sidewalls) of the dies 131/133, as illustrated in FIG. 5A. Note that due to gravity, a width of the underfill material 125 (measured along a horizontal direction in FIG. 5A) increases as the underfill material 125 extends from lower surfaces of the dies 131/133 toward the interposers 100A/100B, in the illustrated embodiment.

After the underfill material 125 is formed, a molding material 129 is formed around the dies 131/133, such that the dies 131/133 are embedded in the molding material 129.

The material and formation method of the molding material 129 may be the same as or similar to that of the molding material 117, thus details are not repeated. In the example of FIG. 5A, sidewalls of the molding material 129 are aligned with respective sidewalls of the interposer 100 and aligned with respective sidewalls of the molding material 117. The structure illustrated in FIG. 5A (not including the support 52) is referred to as a Chip-On-Wafer (CoW) structure, and the device formed is referred to as a CoW device 150.

FIG. 5B illustrates a top view of the CoW device 150. FIG. 5A corresponds to a cross-sectional view along cross-section A-A in FIG. 5B. In FIG. 5B, the boundaries (e.g., sidewalls) of the molding material 129 are shown. The boundaries of the molding material 129 overlaps with respective sidewalls of the first interposer 100A and respective sidewalls of the second interposer 100B (see FIG. 4). The dash line 145 in FIG. 5B illustrates the location of the gap G between the interposers 100A and 100B. Therefore, the area within the boundary of the molding material 129 (e.g., on the left side of the dashed line 145) represent location of the first interposer 100A, and the area on the right side of the dashed line 145 represent location of the second interposer 100B.

In the example of FIG. 5B, a plurality of dies (e.g., 131A, 131B, 131C) are disposed within a joint boundary defined by the interposers 100 (e.g., 100A and 100B). A first portion of the die 131A is disposed within boundaries of the first interposer 100A (e.g., left side of the dashed line 145), and a second portion of the die 131A is disposed within boundaries of the second interposer 100B (e.g., right side of the dashed line 145). The die 131B is disposed completely within the boundaries of the second interposer 100B. FIG. 5B further illustrates a die 131C, which was not in the cross-section A-A, thus not illustrated in FIG. 5A.

Figure 6:
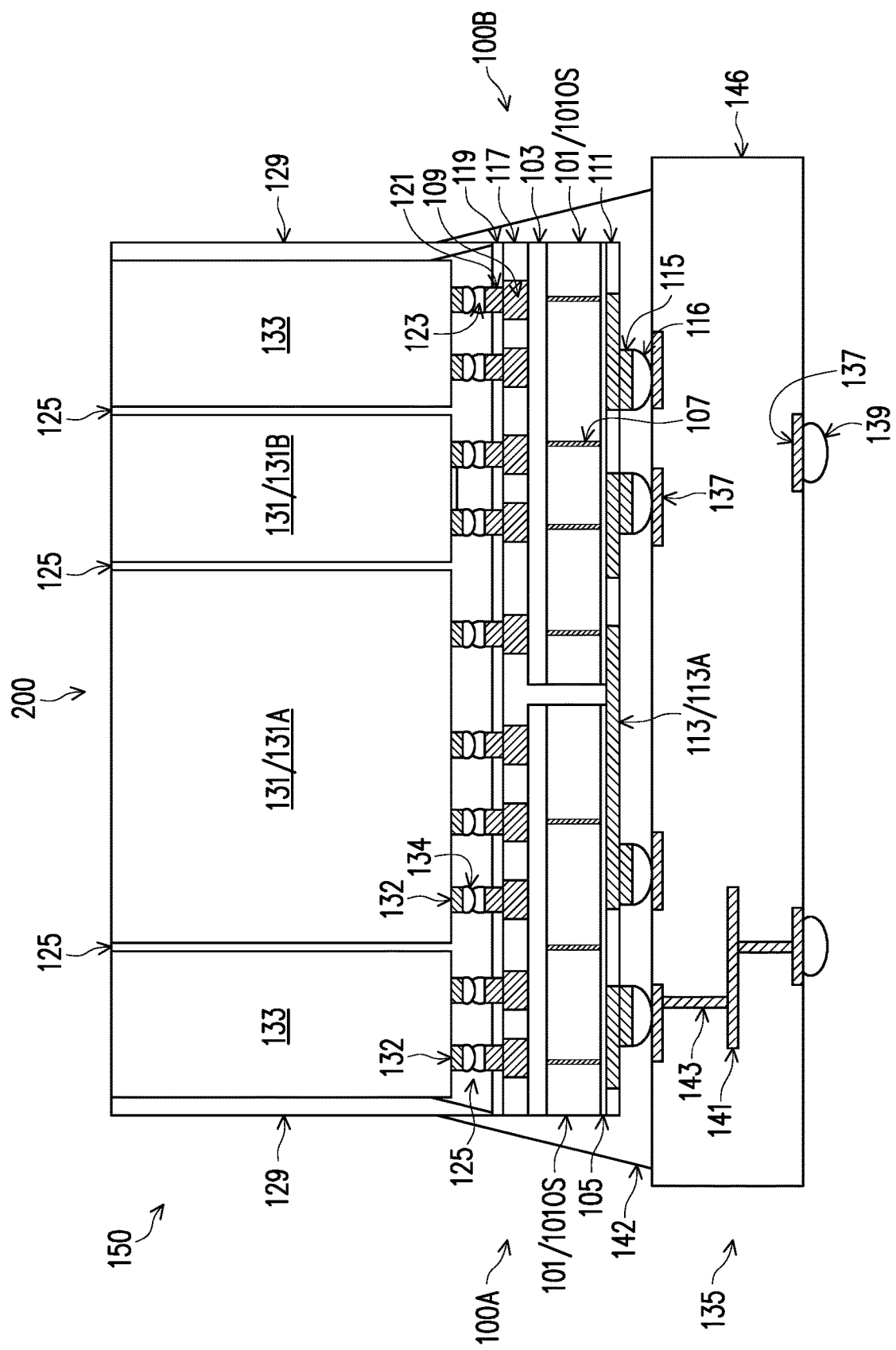
FIG. 6 illustrates a cross-sectional view of a Chip-On-Wafer-On-Substrate (CoWoS) device, in an embodiment.

FIG. 6 illustrates a cross-sectional view of a Chip-On-Wafer-On-Substrate (CoWoS) device 200, in an embodiment. The CoWoS device 200 is formed by attaching (e.g., bonding) the CoW device 150 in FIG. 5A to a substrate 135. In some embodiments, the substrate 135 is a multiple-layer circuit board. For example, the substrate 135 may include one or more dielectric layers 146 formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 135 may include electrically conductive features (e.g., conductive lines 141 and vias 143) formed in/on the substrate 135. As illustrated in FIG. 6, the substrate 135 has conductive pads 137 formed on an upper surface of the substrate 135 and on a lower surface of the substrate 135, which conductive pads 137 are electrically coupled to the conductive features of the substrate 135. The substrate 135 may also have external connectors 139 (e.g., solder balls, copper pillars, copper pillars with solder on top) at a lower surface thereof for electrical connection to another electrical component.

The CoW device 150 is bonded to the substrate 135. For example, a reflow process may be performed to electrically and mechanically couple the CoW device 150 to the substrate 135. In some embodiments, solder regions 116 bond the CoW device 150 with the substrate 135.

Next, an underfill material 142 is formed between the CoW device 150 and the substrate 135. The underfill material 142 may be the same as or similar to the underfill material 125, and may be formed by a same or similar formation method, thus details are not repeated. The underfill material 142 may form fillet around edges (e.g., sidewalls) of the CoW device 150. Note that in FIG. 7, due to gravity, a width of the underfill material 142 (measured along the horizontal direction of FIG. 7) increases as the underfill material 142 extends toward the substrate 135. In other words, the width of the underfill material 142 and the width of the underfill material 125 increase along a same direction (e.g., from CoW device 150 toward the substrate 135).

As more and more dies (e.g., 131, 133) are integrated into the CoWoS structure to provide semiconductor devices with enhanced functionalities and/or more storage capacity (e.g., memory capacity), the size of the interposer and the size of the substrate may need to be increased to accommodate the dies. Without the current disclosed interposer design (e.g., two separate interposer 100A/100B in a CoW device, among other things), all of the dies 131/133 are bonded to a single interposer, and the size of the single interposer may become too large. As a result, it may be difficult to keep the single interposer flat (e.g., having planar upper surface and/or planar lower surface). Warpage of the single interposer may occur due to its large size, which may make it difficult to bond the CoW device to the substrate 135. Warpage of the interposer also causes stress in the solder regions 116, which stress may cause failure in the solder regions 116 and may cause cracking or delamination of the interposer and/or the substrate 135.

In contrast, with the current disclosed CoWoS structure, some of the dies are bonded to the first interposer 100A, and some of the dies are bonded to the second interposer 100B. As a result, each of the interposer 100A/100B still has a small size to avoid or reduce warpage. Additional benefit includes easier bonding with the substrate 135, less stress in the CoWoS structure, and reduced risk of cracking or delamination for the interposer and/or substrate. Furthermore, while the interposers 100A and 100B may be designed to accommodate the CoW structure disclosed herein, the design of the dies 131/133 does not need to be changed for the disclosed CoW structure. In other words, the advantages described above can be achieved without any design penalty for the dies 131/133.

Figure 7:
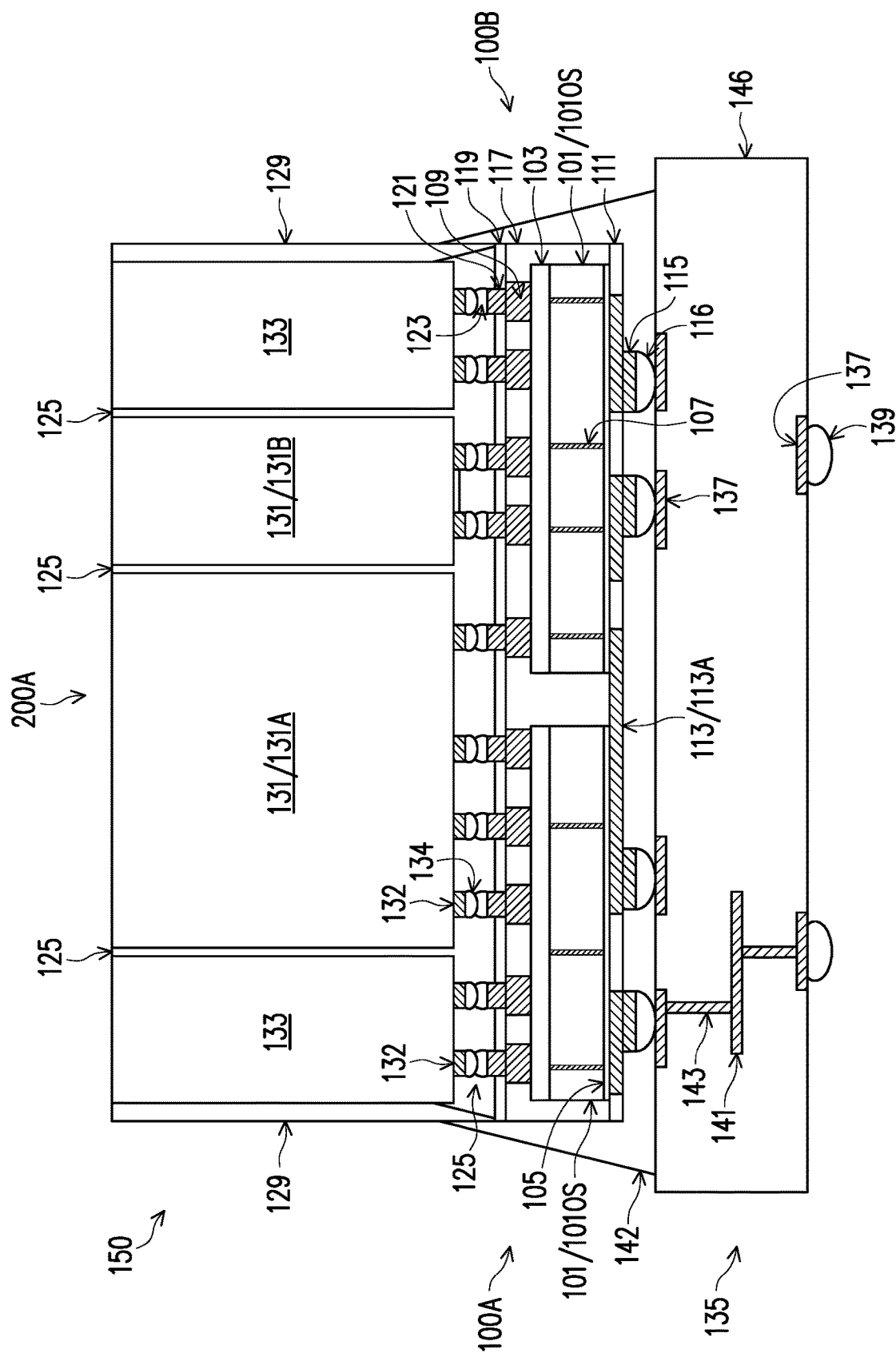
FIG. 7 illustrates a cross-sectional view of a CoWoS device, in another embodiment.

FIG. 7 illustrates a cross-sectional view of a CoWoS device 200A, in another embodiment. The CoWoS device 200A is similar to the CoWoS device 200 of FIG. 6, but the width of the interposers 100 (e.g., 100A, 100B) are reduced, such that the molding material 117 surrounds the interposers 100. In other words, the outer sidewalls 101OS of the interposers 100 are covered by the molding material 117.

Figure 8:
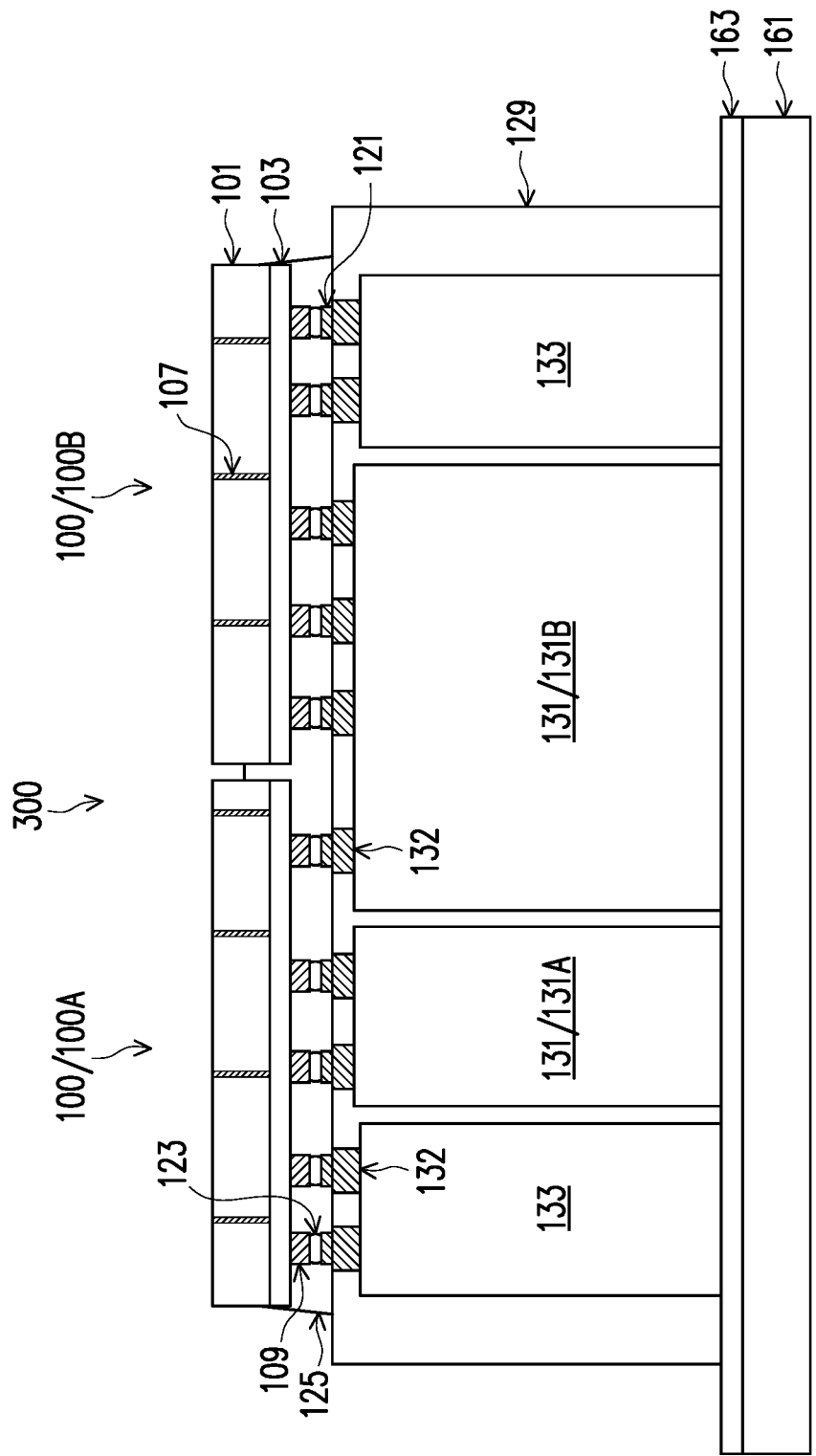
FIGS. 8 and 9 illustrate cross-sectional views of a CoW device at various stages of fabrication, in an embodiment.
Figure 9:
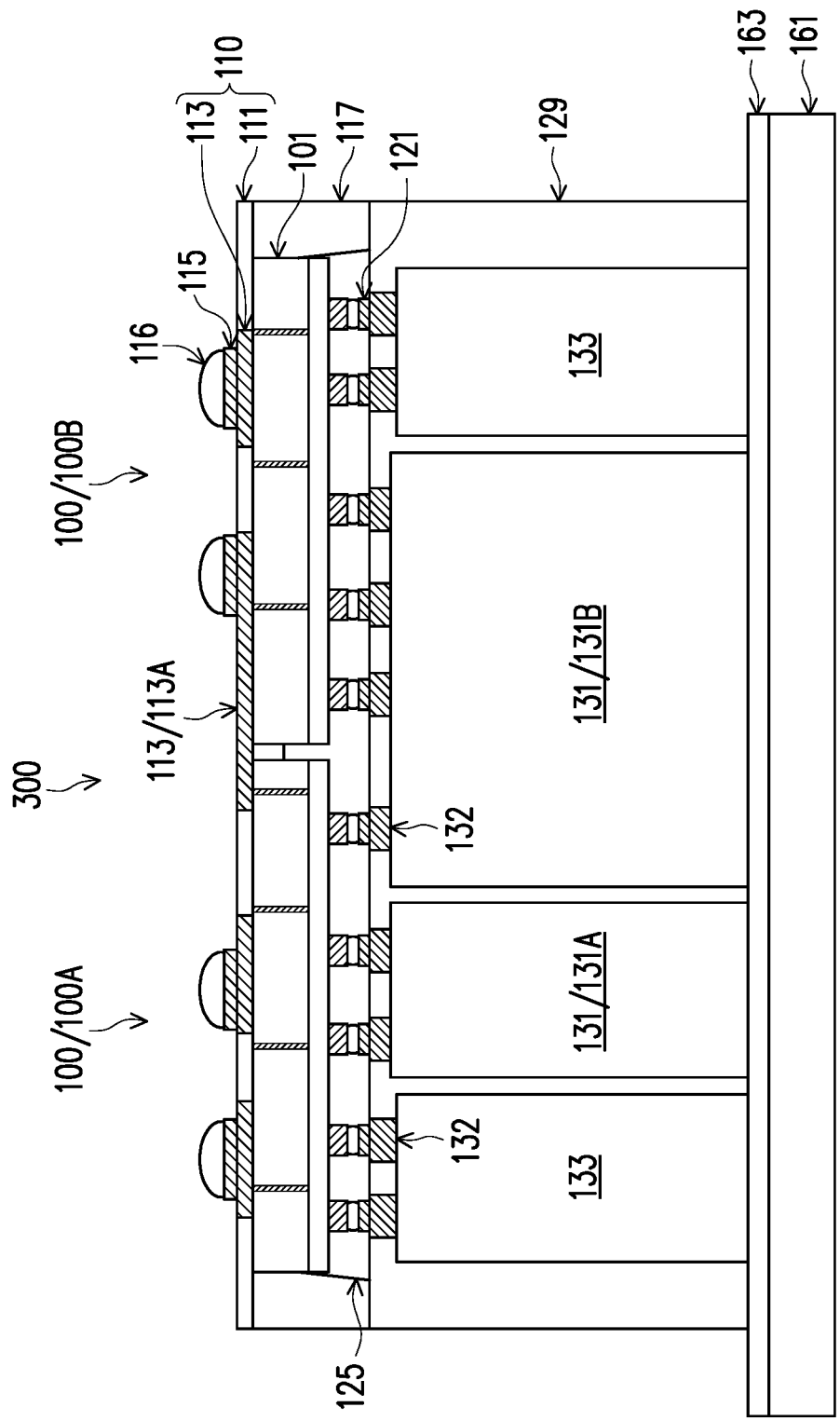

FIGS. 8 and 9 illustrate cross-sectional views of a CoW device 300 at various stages of fabrication, in an embodiment. In FIG. 8, dies 131 (e.g., 131A, 131B) and 133 are attached to a carrier 161 by, e.g., an adhesive layer 163. The carrier 161 may be made of a material such as silicon, polymer, polymer composite, metal foil, ceramic, glass, glass epoxy, beryllium oxide, tape, or other suitable material for structural support. The adhesive layer 163 is deposited or laminated over the carrier 161, in some embodiments. The adhesive layer 163 may be photosensitive and may be easily detached from the carrier 161 by shining, e.g., an ultra-violet (UV) light on the carrier 161 in a subsequent carrier de-bonding process. For example, the adhesive layer 163 may be a light-to-heat-conversion (LTHC) coating.

Next, the molding material 129 is formed over the carrier 161 around the dies 131/133. After the molding material 129 is formed, a planarization process, such as CMP, may be performed to expose upper surfaces of the die connectors 132. In some embodiments, conductive bumps 121, such as micro-bumps, are formed over the die connectors 132. Although not illustrated, a dielectric layer, such as a polymer layer, may be formed over the molding material 129 before the conductive bumps 121 are formed, in which case the conductive bumps 121 extend through the dielectric layer to electrically couple to the die connectors 132.

Next, the first interposer 100A and the second interposer 100B are bonded to the dies 131/133. In the example of FIG. 8, some of the die connectors 132 of the die 131B are bonded to the first interposer 100A, and other die connectors 132 of the die 131B are bonded to the second interposer 100B. In contrast, all of the die connectors of the die 131A (or a die 133) are bonded to a same interposer. Compared with the interposers 100 (e.g., 100A, 100B) in FIG. 1, the interposers 100 in FIG. 8 do not have the backside dielectric layer 105. This is, of course, merely a non-limiting example. Other interposes, such as the interposers 100 in FIG. 1, may also be used to form the structure in FIG. 8.

Next, the underfill material 125 is formed between the interposers 100 (e.g., 100A and 100B) and the upper surface of the molding material 129. The underfill material 125 may fill or partially fill a gap between the interposers 100. In the illustrated embodiment, due to gravity, a width of the underfill material 125, measured along the horizontal direction in FIG. 8, increases as the underfill material 125 extends from a lower surface of the interposers 100 toward the molding material 129.

Next, in FIG. 9, the molding material 117 is formed over the molding material 129 around the interposers 100 and around the underfill material 125. A planarization process, such as CMP, may be performed to achieve a planar upper surface between the molding material 117 and the backside of the interposers 100.

Next, the redistribution structure 110, which includes the dielectric layer 11 and the conductive features 113, is formed over the molding material 117 and is electrically coupled to the interposers 100. Next, conductive connectors 115, and optionally the solder regions 116, are formed over and electrically coupled to the redistribution structure 110. Next, a carrier de-bonding process is performed to remove the carrier 161 and the adhesive layer 163, and the structure in FIG. 9, after carrier de-bonding, illustrates a CoW device 300.

Figure 10:
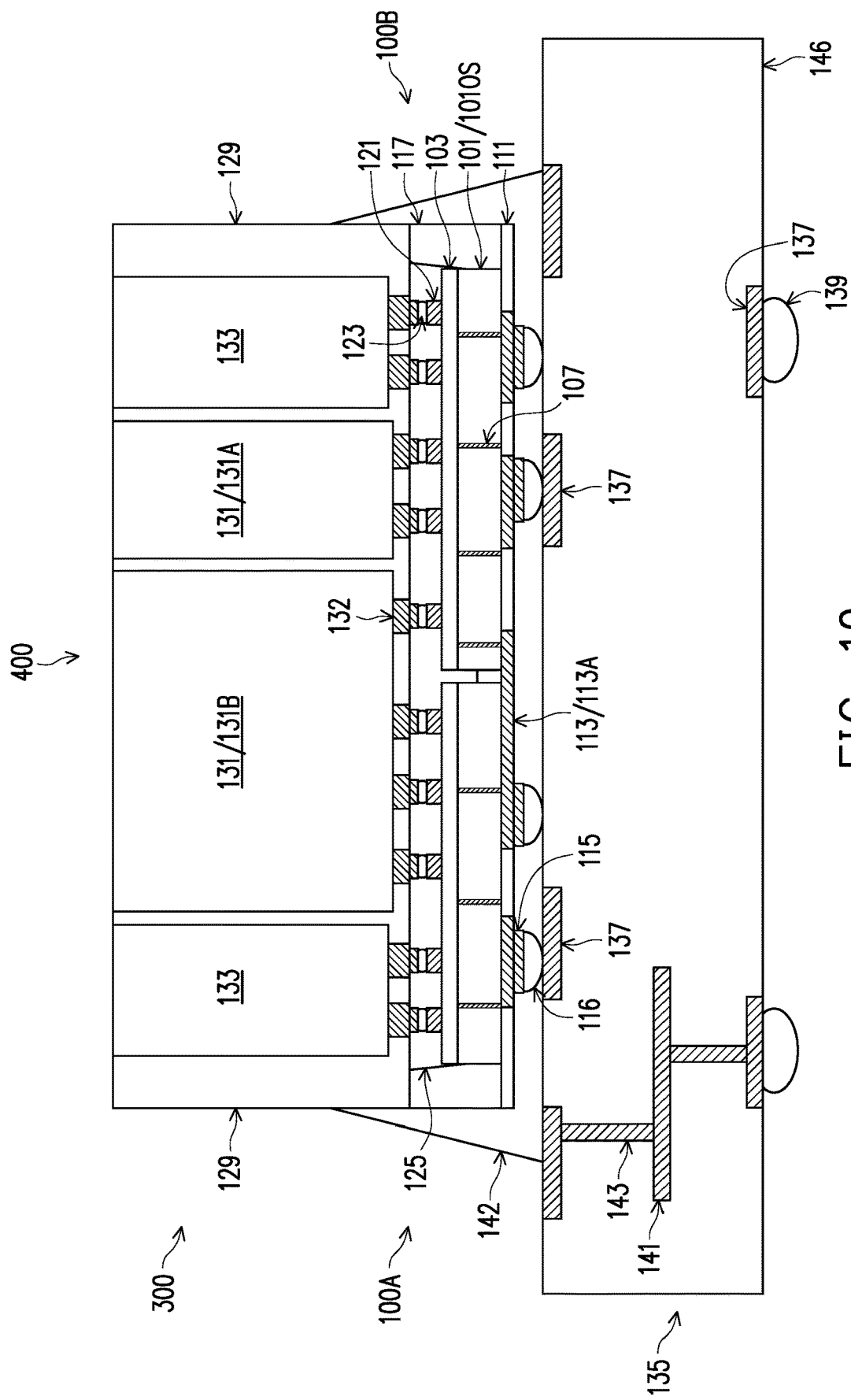
FIG. 10 illustrates a cross-sectional view of a CoWoS device, in an embodiment.

FIG. 10 illustrates a cross-sectional view of a CoWoS device 400, in an embodiment. The CoWoS device 400 is formed by bonding the conductive connectors 115 of the CoW device 300 in FIG. 9 to conductive pads 137 of the substrate 135, e.g., through a reflow process. The substrate 135 has been described above, thus details are not repeated here.

After the CoW device 300 is bonded to the substrate 135, the underfill material 142 is formed on the substrate 135 and around edges of the CoW device 300. In the example of FIG. 10, due to gravity, a width of the underfill material 142, measured along the horizontal direction in FIG. 10, increases as the underfill material 142 extends toward the substrate 135. Note that a width of the underfill material 125, however, decreases as it extends toward the substrate 135. In other words, a width of the underfill material 142 increase along a first direction (e.g., downward toward the substrate 135), and a width of the underfill material 125 increase along an opposite second direction (e.g., upward away from the substrate 135).

FIGS. 11-17 illustrate various embodiment cross-sectional views of a front-side portion (e.g., a portion at the front-side) of an interposer, in some embodiments. In particular, FIGS. 11-17 illustrates different embodiment structures for the conductive bumps at the front-side of an interposer. The various embodiment conductive bump structures illustrated in FIGS. 11-17 may be used as the conductive bump structure in the CoW devices 150 or 300, as one skilled in the art will readily appreciate.

Figure 11:
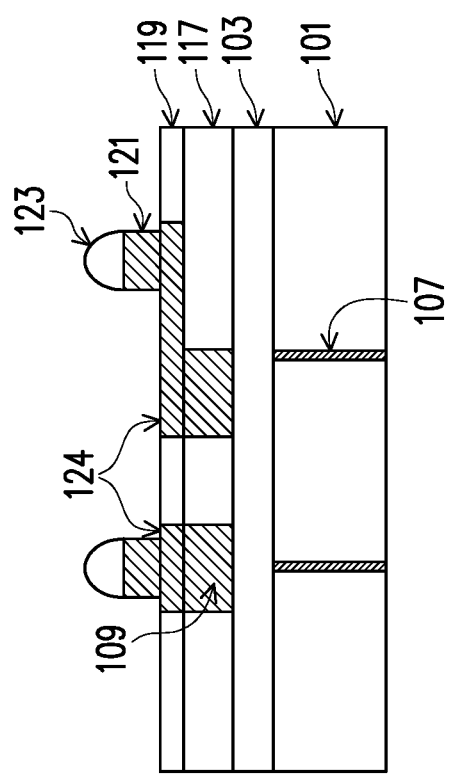
FIGS. 11-17 illustrate various embodiment cross-sectional views of a front-side portion of an interposer, in some embodiments.

Referring to FIG. 11, the conductive bumps structure in FIG. 11 is similar to that in FIG. 4, but with conductive lines 124 (e.g., copper lines functioning as redistribution lines) formed in the dielectric layer 119 (e.g., a polyimide layer) and electrically couple to the conductive bumps 109. In other words, the dielectric layer 119 and the conductive lines 124 form a redistribution structure at the front-side of the interposer. In addition, micro-bumps 121 are formed over and electrically coupled to the conductive lines 124. Solder regions 123 are optionally formed over the micro-bumps 121.

Figure 12:
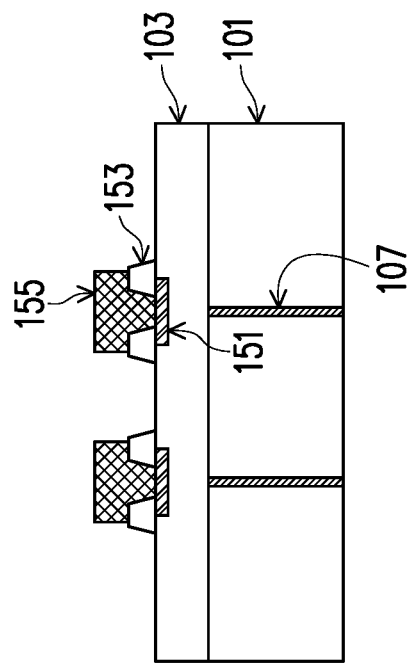
Figure 13:
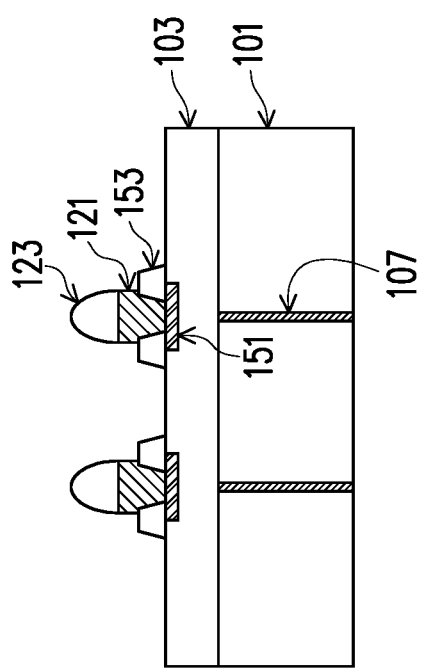
Figure 14:
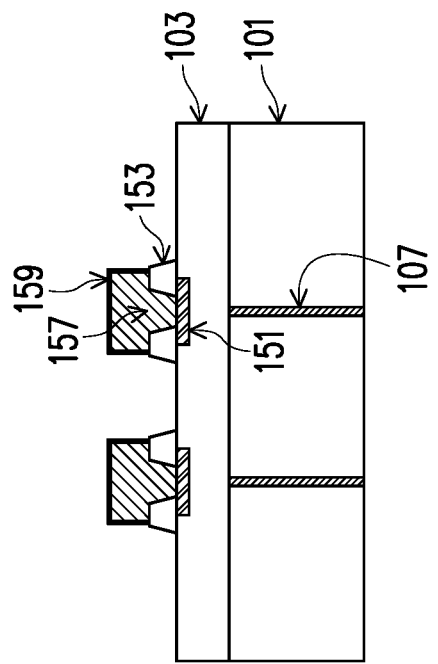

FIGS. 12-14 illustrates three embodiment conductive bump structures with aluminum pads 151 (instead of conductive bumps 109) formed at an upper surface of the front-side dielectric layer 103 and electrically coupled to the TSVs 107. In FIG. 12, a passivation layer 153 (e.g., a polymer layer) is formed on the front-side dielectric layer 103, and micro-bumps 121 are formed over the passivation layer 153 and extend through the passivation layer 153 to electrically couple to the aluminum pads 151.

In FIG. 13, the passivation layer 153 (e.g., a polymer layer) is formed on the front-side dielectric layer 103, and gold bumps 155 are formed over the passivation layer 153 and extend through the passivation layer 153 to electrically couple to the aluminum pads 151.

In FIG. 14, the passivation layer 153 (e.g., a polymer layer) is formed on the front-side dielectric layer 103, and copper pillars 157 are formed over the passivation layer 153 and extend through the passivation layer 153 to electrically couple to the aluminum pads 151. An electroless nickel electroless palladium immersion gold (ENEPIG) layer 159 is then formed over exposed surfaces of the copper pillars 157.

Figure 15:
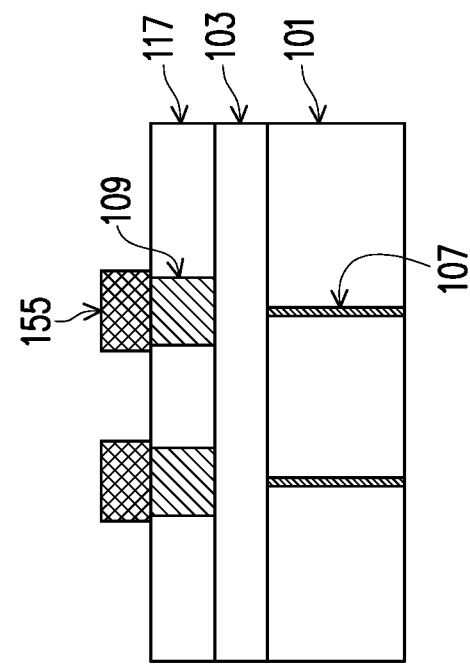
Figure 16:
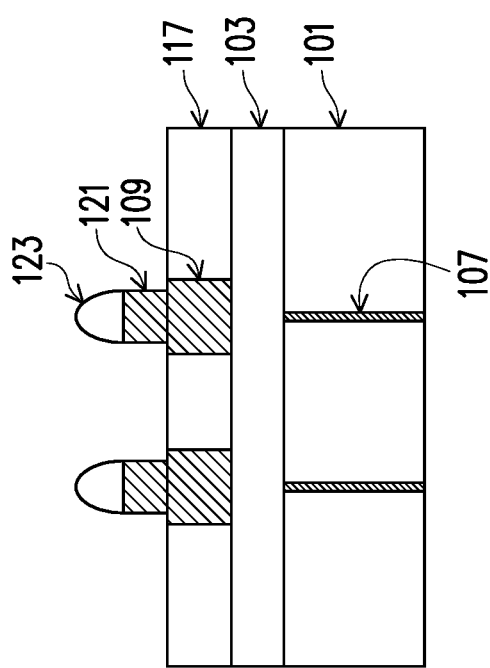
Figure 17:
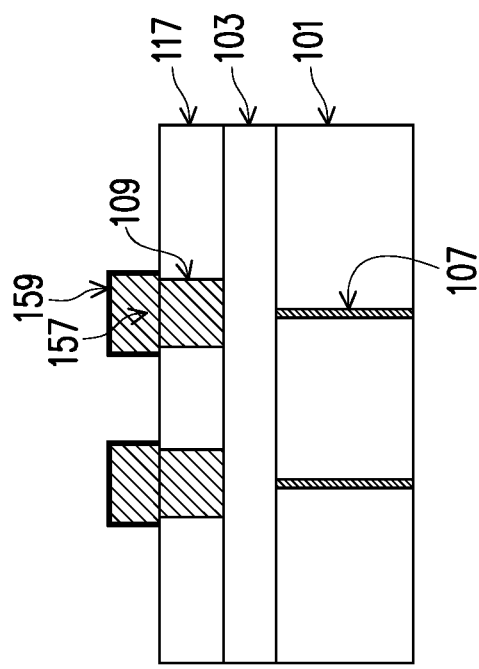

FIGS. 15-17 illustrates three embodiment conductive bump structures with copper pillars 109 formed in the molding material 117 and electrically coupled to the TSVs 107, similar to FIGS. 6 and 7. In FIG. 15, micro-bumps 121 are formed over the molding material 117 and on the copper pillars 109. Note that the dielectric layer 119 in FIG. 6 is not formed here, and therefore, sidewalls of the micro-bumps 121 are completely exposed. Solder regions 123 may be formed on the micro-bumps 121. In FIG. 16, gold bumps 155 are formed over the molding material 117 and on the copper pillars 109. In FIG. 17, copper pillars 157 are formed over the molding material 117 and on the copper pillars 109. An ENEPIG layer 159 is then formed over sidewalls and an upper surface of the copper pillars 157.

Figure 18:
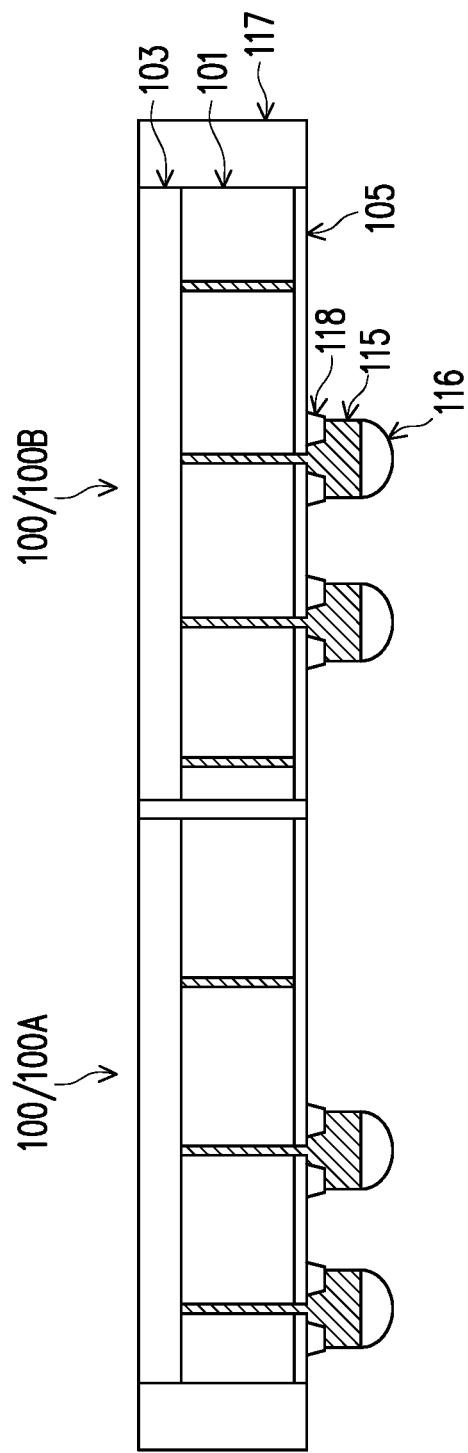
FIGS. 18 and 19 illustrate various embodiment cross-sectional views of a backside portion of an interposer, in some embodiments.
Figure 19:
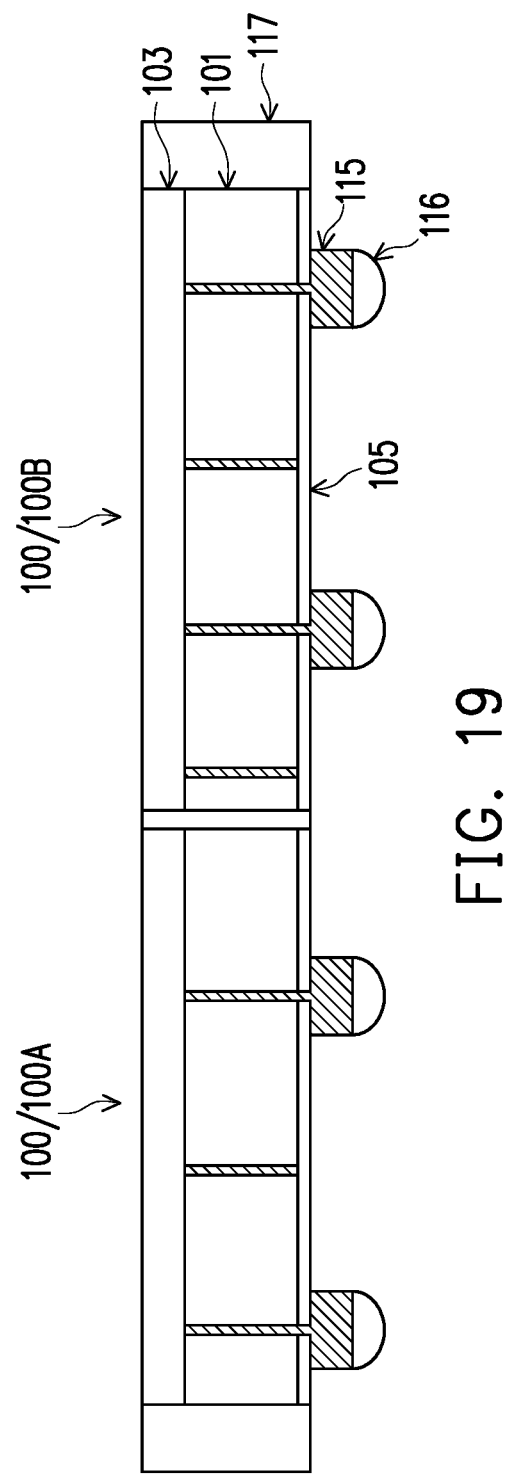

FIGS. 18 and 19 illustrate various embodiment cross-sectional views of a backside portion (e.g., a portion at the backside) of an interposer, in some embodiments. In particular, FIGS. 18 and 19 illustrate different embodiment structures for the conductive bumps at the backside of the interposer. The various embodiment conductive bump structures illustrated in FIGS. 18 and 19 may be used as the backside conductive bump structure in the CoW devices 150 or 300, as one skilled in the art will readily appreciate. Note that in FIGS. 18 and 19, the redistribution structure 110 is not formed on the backside of the interposers 100.

In FIG. 18, a passivation layer 118, such as a layer of PBO, is formed on the backside dielectric layer 105 (e.g., a silicon nitride layer) of the interposer 100 (e.g., 100A, or 100B). Next, C4 bumps 115 are formed on the passivation layer 118 and extend through the passivation layer 118 to electrically couple to the TSVs 107. Solder regions 116 may be formed on the C4 bumps 115.

In FIG. 19, the backside dielectric layer 105 of the interposer 100 is a polymer layer (e.g., a polyimide layer). The C4 bumps are formed directly on the backside dielectric layer 105 and extend through the backside dielectric layer 105 to electrically couple to the TSVs 107. Solder regions 116 may be formed on the C4 bumps 115.

Variations and modification to the disclosed embodiments are possible and are fully intended to be included within the scope of the present disclosure. For example, although two separate interposers are used as an example to form CoW devices, the principle disclosed herein may be applied to embodiments where more than two separate interposers are used to form CoW devices and CoWoS devices. In addition, the various front-side bump structures and backside bumps structures disclosed herein may be combined in any suitable manner to form CoW devices and CoWoS devices.

Figure 20:
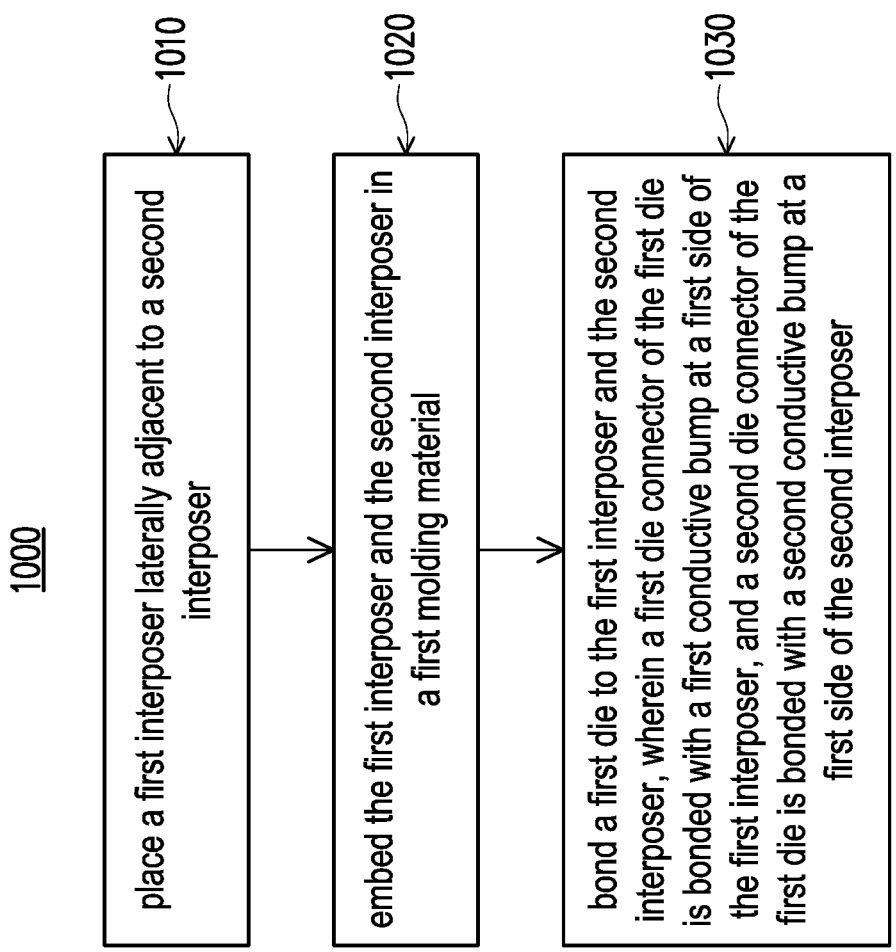
FIG. 20 is a flow chart of method for forming a semiconductor structure, in some embodiments.

FIG. 20 illustrates a flow chart of a method 1000 of fabricating a semiconductor structure, in accordance with some embodiments. It should be understood that the embodiment method shown in FIG. 20 is merely an example of many possible embodiment methods. One of ordinary skill in the art would recognize many variations, alternatives, and modifications. For example, various steps as illustrated in FIG. 20 may be added, removed, replaced, rearranged and repeated.

Referring to FIG. 20, at step 1010, a first interposer is placed laterally adjacent to a second interposer. At step 1020, the first interposer and the second interposer are embedded in a first molding material. At step 1030, a first die is bonded to the first interposer and the second interposer, wherein a first die connector of the first die is bonded with a first conductive bump at a first side of the first interposer, and a second die connector of the first die is bonded with a second conductive bump at a first side of the second interposer.

Advantages of the present disclosure include reduced warpage in the interposers 100A and 100B, due to reduced size of each of the interposers. Additional advantage includes less stress at the bonding joints between the interposers and the substrate, and reduced risk of cracking or delamination. Device reliability is improved, and yield of semiconductor processing is improved. These advantages could be achieved without re-designing the dies attached to the interposers.

In accordance with an embodiment, a semiconductor structure includes: a first interposer; a second interposer laterally adjacent to the first interposer, wherein the second interposer is spaced apart from the first interposer; and a first die attached to a first side of the first interposer and attached to a first side of the second interposer, wherein the first side of the first interposer and the first side of the second interposer face the first die. In an embodiment, a first portion of the first die is disposed within lateral extents of the first interposer, and a second portion of the first die is disposed within lateral extents of the second interposer. In an embodiment, the semiconductor structure further comprises a second die attached to the first side of the second interposer, wherein the second die is disposed within the lateral extents of the second interposer. In an embodiment, the semiconductor structure further comprises a redistribution structure at a second side of the first interposer opposing the first side of the first interposer, wherein the redistribution structure extends continuously from the first interposer to the second interposer. In an embodiment, a first portion of the first die has a first die connector, and a second portion of the first die has a second die connector, wherein the first die connector is bonded to a first conductive bump at the first side of the first interposer, and the second die connector is bonded to a second conductive bump at the first side of the second interposer. In an embodiment, the semiconductor structure of further comprises: a first molding material, wherein the first interposer and the second interposer are embedded in the first molding material, wherein the first molding material extends along the first side of the first interposer and along the first side of the second interposer, wherein the first molding material fills a gap between the first interposer and the second interposer; an underfill material between the first molding material and the first die; and a second molding material around the first die and around the underfill material. In an embodiment, the first molding material covers a first sidewall of the first interposer facing away from the second interposer, and the first molding material covers a second sidewall of the second interposer facing away from the first interposer. In an embodiment, the first molding material covers a first sidewall of the first interposer facing the second interposer and exposes a second sidewall of the first interposer facing away from the second interposer, wherein the first molding material covers a third sidewall of the second interposer facing the first interposer and exposes a fourth sidewall of the second interposer facing away from the first interposer. In an embodiment, the semiconductor structure further comprises: a first molding material around the first interposer and around the second interposer; an underfill material between the first interposer and the first die and between the second interposer and the first die, wherein the first molding material surrounds the underfill material, wherein the first molding material and the underfill material have a coplanar surface; and a second molding material around the first die, wherein the second molding material contacts the coplanar surface. In an embodiment, a width of the underfill material decreases as the underfill material extends from the coplanar surface toward the first interposer. In an embodiment, the semiconductor structure further comprises a substrate attached to a second side of the first interposer and to a second side of the second interposer.

In accordance with an embodiment, a semiconductor structure includes: a redistribution structure; a first interposer on the redistribution structure; a second interposer on the redistribution structure and laterally adjacent to the first interposer, wherein the second interposer is spaced apart from the first interposer; and a first die over the first interposer and over the second interposer, wherein a first die connector of the first die is bonded to a first conductive bump of the first interposer, and a second die connector of the first die is bonded to a second conductive bump of the second interposer. In an embodiment, the redistribution structure extends continuously from the first interposer to the second interposer. In an embodiment, the redistribution structure extends beyond lateral extents of the first interposer and beyond lateral extents of the second interposer. In an embodiment, a first sidewall of the redistribution structure is aligned with a first sidewall of the first interposer, and a second sidewall of the redistribution structure is aligned with a second sidewall of the second interposer. In an embodiment, the semiconductor structure further comprises: an underfill material between the first interposer and the first die and between the second interposer and the first die; a first molding material on the redistribution structure, wherein the first molding material surrounds the first interposer, the second interposer, and the underfill material; and a second molding material on the first molding material and on the underfill material, wherein the second molding material surrounds the first die, wherein the underfill material has a first width measured at a first interface with the first interposer and has a second width measured at a second interface with the second molding material, wherein the first width is smaller than the second width.

In accordance with an embodiment, a method of forming a semiconductor structure includes: placing a first interposer laterally adjacent to a second interposer; embedding the first interposer and the second interposer in a first molding material; and bonding a first die to the first interposer and the second interposer, wherein a first die connector of the first die is bonded with a first conductive bump at a first side of the first interposer, and a second die connector of the first die is bonded with a second conductive bump at a first side of the second interposer. In an embodiment, the method further comprises: before embedding the first interposer and the second interposer, forming a redistribution structure along a second side of the first interposer and along a second side of the second interposer. In an embodiment, the method further comprises bonding a second die to the second interposer, wherein after the second die is bonded, the second die is disposed within lateral extents of the second interposer. In an embodiment, the method further comprises, after bonding the first die, bonding a substrate to a second side of the first interposer and to a second side of the second interposer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor structure, the method comprising:
    placing a first interposer laterally adjacent to a second interposer;
    embedding the first interposer and the second interposer in a first molding material;
    bonding a first die to the first interposer and the second interposer, wherein a first die connector of the first die is bonded with a first conductive bump at a first side of the first interposer, and a second die connector of the first die is bonded with a second conductive bump at a first side of the second interposer;
    forming an underfill material between the first die and the first interposer; and
    forming a second molding material around the first die, wherein the first molding material contacts and extends along the second molding material.

2. The method of claim 1, further comprising, forming a redistribution structure at an opposing second side of the first interposer and at an opposing second side of the second interposer, wherein a conductive line of the redistribution structure extends continuously from the first interposer to the second interposer.

3. The method of claim 1, further comprising bonding a second die to the second interposer, wherein after the second die is bonded, the second die is disposed within lateral extents of the second interposer.

4. The method of claim 1, wherein a first sidewall of the first interposer distal from the second interposer is covered by the first molding material, and a second sidewall of the second interposer distal from the first interposer is covered by the first molding material.

5. The method of claim 1, wherein a first sidewall of the first interposer distal from the second interposer is flush with a first sidewall of the first molding material, and a second sidewall of the second interposer distal from the first interposer is flush with a second sidewall of the first molding material.

6. The method of claim 1, wherein the second molding material contacts and extends along the underfill material.

7. The method of claim 1, wherein the first molding material contacts and extends along sidewalls of the underfill material.

8. The method of claim 1, further comprising, after bonding the first die, bonding a substrate to a second side of the first interposer and to a second side of the second interposer.

9. A method of forming a semiconductor structure, the method comprising:
    embedding a first interposer and a second interposer in a first molding material, wherein the first interposer is laterally adjacent to the second interposer;
    forming a redistribution structure at a backside of the first interposer and at a backside of the second interposer, wherein a conductive line of the redistribution structure extends continuously from the first interposer to the second interposer;
    bonding a first die to a front side of the first interposer and to a front side of the second interposer, wherein after boding the first die, a first portion of the first die is disposed within lateral extents of the first interposer, and a second portion of the first die is disposed within lateral extents of the second interposer;
    forming an underfill material between the first die and the first interposer; and
    forming a second molding material around the first die, wherein the redistribution structure is formed after embedding the first interposer and the second interposer and before bonding the first die, wherein the underfill material is formed after bonding the first die, and wherein the second molding material is formed after forming the underfill material.

10. The method of claim 9, further comprising, before forming the second molding material, bonding a second die to the front side of the second interposer, wherein after bonding the second die, the second die is disposed laterally between opposing sidewalls of the second interposer.

11. The method of claim 9, wherein the second molding material is formed to be spaced apart from the first molding material, wherein the second molding material contacts and extends along sidewalls of the underfill material.

12. A method of forming a semiconductor structure, the method comprising:
    attaching a first die and a second die to a carrier;
    forming a first molding material on the carrier around the first die and the second die;
    bonding a first interposer to the first die and the second die, wherein the first die and the second die are interposed between the first interposer and the carrier;
    bonding a second interposer to the second die;
    forming an underfill material between the first die and the first interposer, and between the second die and the second interposer;
    forming a second molding material over the first molding material around the first interposer, the second interposer, and the underfill material, wherein the second molding material contacts and extends along sidewall of the underfill material, wherein the second molding material contacts and extends along an upper surface of the first molding material distal from the carrier; and forming a redistribution structure over the second molding material, the first interposer, and the second interposer, wherein a conductive line of the redistribution structure extends continuously from the first interposer to the second interposer.

13. The method of claim 12, further comprising:
forming conductive bumps over the redistribution structure; and
bonding the conductive bumps to a substrate.

14. The method of claim 12, wherein bonding the first interposer is performed after forming the first molding material.

15. The method of claim 14, wherein forming the underfill material is performed after bonding the first interposer and after bonding the second interposer.

16. The method of claim 15, wherein forming the second molding material is performed after forming the underfill material.

17. The method of claim 16, wherein forming the redistribution structure is performed after forming the second molding material.

18. The method of claim 12, further comprising removing the carrier after forming the redistribution structure.

19. The method of claim 13, further comprising forming another underfill material between the redistribution structure and the substrate, wherein the another underfill material extends along the first molding material and the second molding material.

20. The method of claim 12, wherein the first die is disposed within lateral extents of the first interposer.

\* \* \* \* \*